(12) United States Patent
Werber

(10) Patent No.: US 9,337,827 B2
(45) Date of Patent: May 10, 2016

(54) ELECTRONIC CIRCUIT WITH A REVERSE-CONDUCTING IGBT AND GATE DRIVER CIRCUIT

(71) Applicant: Infineon Technologies AG, Neubiberg (DE)

(72) Inventor: Dorothea Werber, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/941,797

(22) Filed: Jul. 15, 2013

(65) Prior Publication Data

US 2015/0015309 A1    Jan. 15, 2015

(51) Int. Cl.
| | | |
|---|---|---|
| *H03K 3/00* | (2006.01) |
| *H03K 17/567* | (2006.01) |
| *H01L 29/739* | (2006.01) |
| *H01L 29/06* | (2006.01) |
| *H01L 29/08* | (2006.01) |

(52) U.S. Cl.
CPC .......... *H03K 17/567* (2013.01); *H01L 29/0696* (2013.01); *H01L 29/0834* (2013.01); *H01L 29/7397* (2013.01)

(58) Field of Classification Search
CPC ........... H01L 2224/00014; H01L 2224/13055; H01L 2224/32145; H01L 2224/48091; H01L 2224/131; H01L 27/2436; H01L 27/2463; H01L 45/04; H01L 45/06; H01L 23/28; H01L 23/48; H01L 23/481; H01L 23/485
USPC .................................................. 327/109, 434
See application file for complete search history.

(56) References Cited

U.S. PATENT DOCUMENTS

| | | | |
|---|---|---|---|
| 5,475,257 A | 12/1995 | Hashimoto et al. | |
| 7,535,283 B2 * | 5/2009 | Kojima | 327/538 |
| 8,203,366 B2 * | 6/2012 | Lee | 327/108 |
| 8,384,151 B2 | 2/2013 | Pfirsch | |
| 2004/0027762 A1 * | 2/2004 | Ohi et al. | 361/100 |

(Continued)

FOREIGN PATENT DOCUMENTS

| | | |
|---|---|---|
| DE | 102006049354 B3 | 6/2008 |
| EP | 0269095 B1 | 2/1994 |

(Continued)

OTHER PUBLICATIONS

Pfirsch, et al. "Reverse Conducting IGBT." U.S. Appl. No. 13/529,166, filed Jun. 21, 2012.
Werber, et al. "Reverse Conducting IGBT." U.S. Appl. No. 13/529,185, filed Jun. 21, 2012.

*Primary Examiner* — John Poos
(74) *Attorney, Agent, or Firm* — Murphy, Bilak & Homiller, PLLC

(57) ABSTRACT

An electronic circuit includes a reverse-conducting IGBT and a driver circuit. A first diode emitter efficiency of the reverse-conducting IGBT at a first off-state gate voltage differs from a second diode emitter efficiency at a second off-state gate voltage. A driver terminal of the driver circuit is electrically coupled to a gate terminal of the reverse-conducting IGBT. In a first state the driver circuit supplies an on-state gate voltage at the driver terminal. In a second state the driver circuit supplies the first off-state gate voltage, and in a third state the driver circuit supplies the second off-state gate voltage at the driver terminal. The reverse-conducting IGBT may be operated in different modes such that, for example, overall losses may be reduced.

20 Claims, 9 Drawing Sheets

(56) References Cited

U.S. PATENT DOCUMENTS

| | | |
|---|---|---|
| 2008/0030257 A1* | 2/2008 | Jasberg et al. ............... 327/434 |
| 2008/0122497 A1* | 5/2008 | Ishikawa et al. ............. 327/108 |
| 2009/0085103 A1 | 4/2009 | Hille et al. |
| 2010/0123189 A1 | 5/2010 | Venkatraman et al. |
| 2012/0099234 A1* | 4/2012 | Inoue et al. ..................... 361/87 |
| 2012/0299624 A1* | 11/2012 | Sugahara ..................... 327/109 |
| 2013/0063188 A1* | 3/2013 | Sogo et al. ................... 327/109 |
| 2013/0082301 A1 | 4/2013 | Onozawa et al. |
| 2013/0278298 A1* | 10/2013 | Curbelo et al. ............... 327/109 |
| 2013/0314834 A1* | 11/2013 | Tamaki et al. ............... 361/93.1 |

FOREIGN PATENT DOCUMENTS

| | | |
|---|---|---|
| JP | 2001037207 A | 2/2001 |
| JP | 2006074994 A | 3/2006 |
| JP | 2007174134 A | 7/2007 |
| JP | 2008278552 A | 11/2008 |
| JP | 2010129697 A | 6/2010 |
| JP | 2013098336 A | 5/2013 |

* cited by examiner

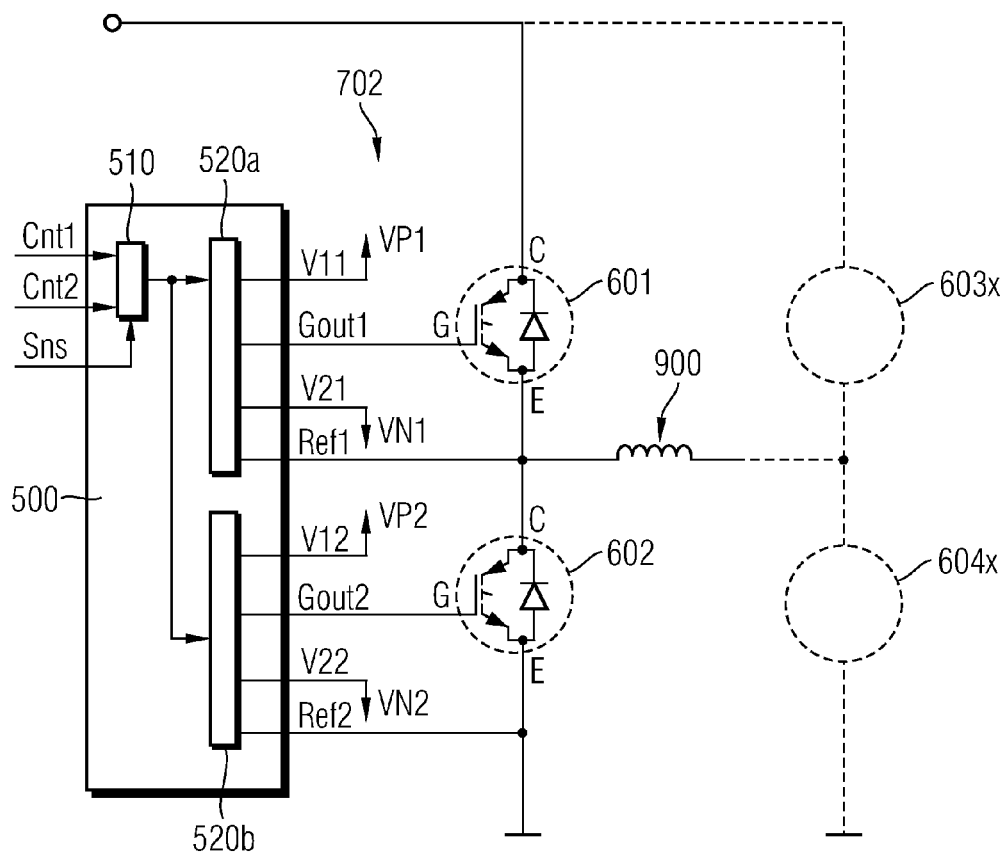

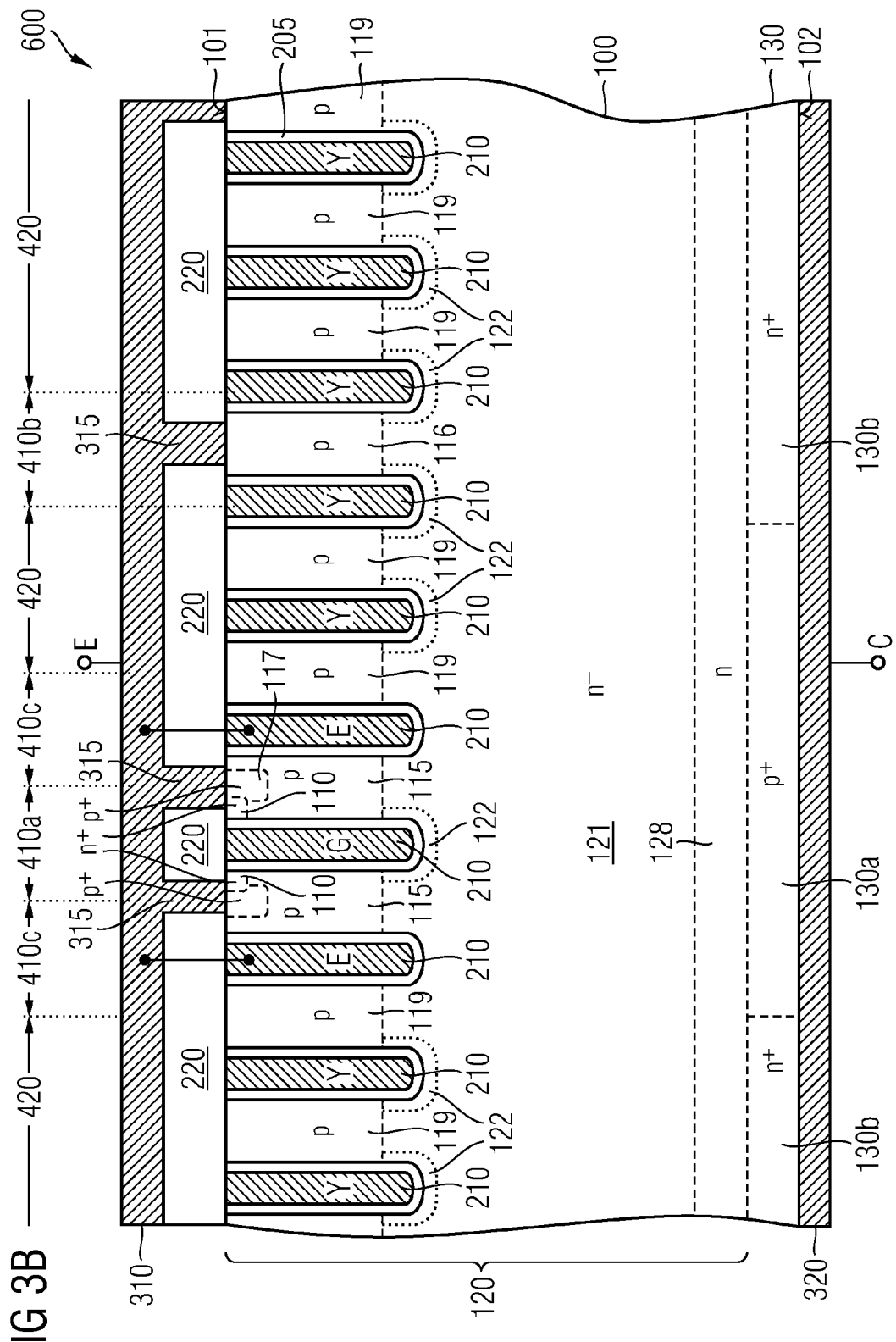

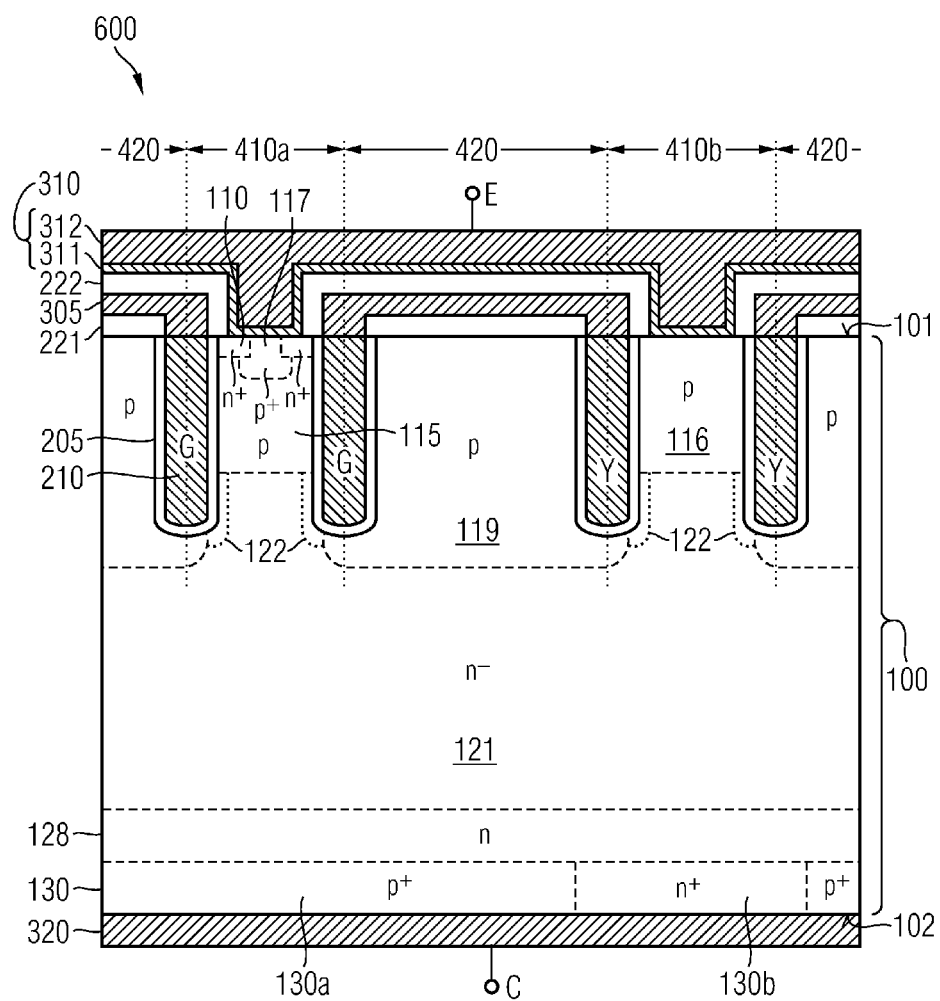

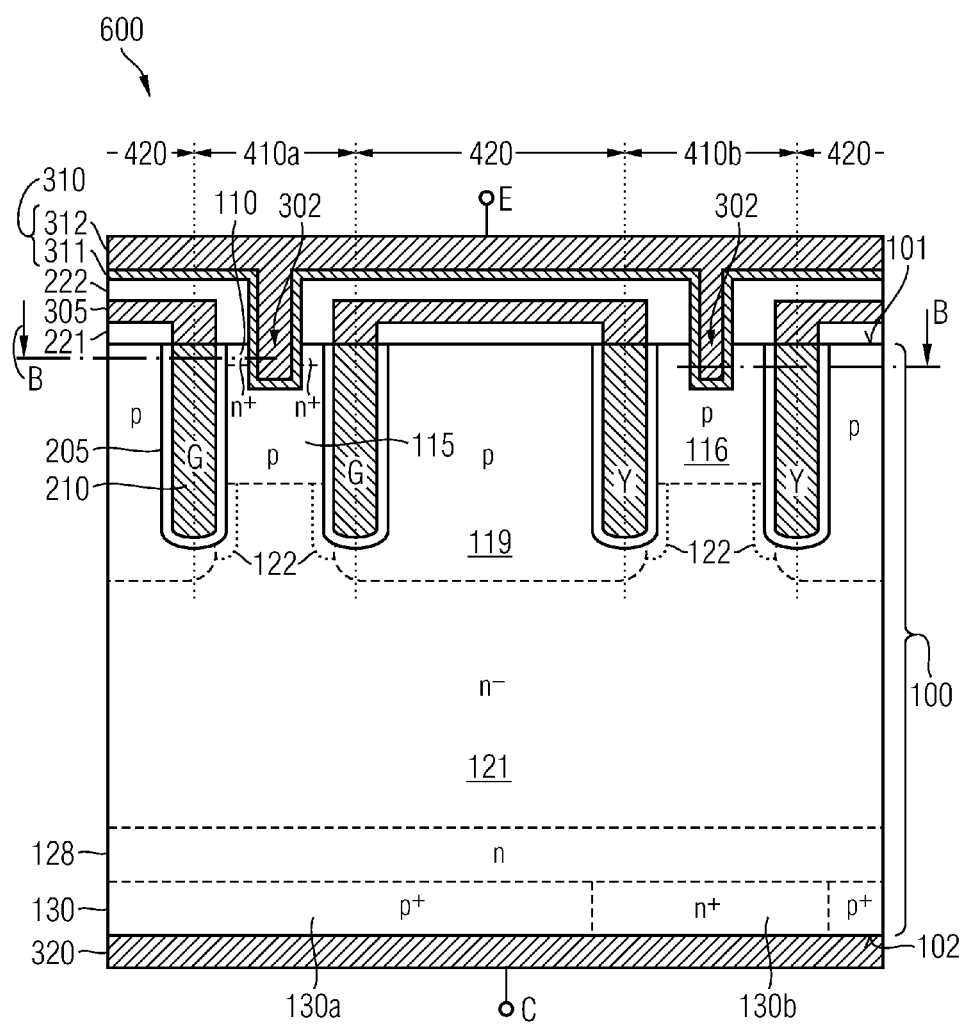

ELECTRONIC CIRCUIT WITH A REVERSE-CONDUCTING IGBT AND GATE DRIVER CIRCUIT

BACKGROUND

IGBTs (insulated gate bipolar transistors) typically switch inductive loads, such as motor windings. In an on state, a current flowing through the inductor generates a magnetic field. When the current is switched off, the magnetic field energy stored in the inductor generates a high voltage drop across the inductor, wherein the polarity of the generated voltage is opposite to the polarity of a voltage drop in the on state. A flyback or free-wheeling diode, which may be arranged parallel to the switch or the inductor and which is by-passed or reverse-based in the on-state, short-circuits the inductor or the switch in the off-state and conveys a current until the magnetic field energy stored in the inductor is dissipated. Reverse-conducting IGBTs monolithically integrate an IGBT, effective as an electronic switch, and a free-wheeling diode parallel to the switch. It is desirable to improve electronic circuits that include reverse-conducting IGBTs.

SUMMARY

According to an embodiment, an electronic circuit includes a reverse-conducting IGBT and a driver circuit. A first diode emitter efficiency of the reverse-conducting IGBT at a first off-state gate voltage differs from a second diode emitter efficiency at a second off-state gate voltage. A driver terminal of the driver circuit is electrically coupled to a gate terminal of the reverse-conducting IGBT. In a first state, the driver circuit supplies an on-state gate voltage at the driver terminal. In a second state, the driver circuit supplies the first off state gate voltage at the driver terminal. In a third state, the driver circuit supplies the second off-state gate voltage at the driver terminal.

An example half-bridge circuit includes a first and a second reverse-conducting IGBT and a first and a second driver circuit. A first diode emitter efficiency of each of the reverse-conducting IGBTs at a first off-state gate voltage differs from a second diode emitter efficiency at a second off-state gate voltage. A driver terminal of each of the driver circuits is electrically coupled to a gate terminal of a corresponding one of the reverse-conducting IGBTs. Each of the driver circuits supplies, at the driver terminal, an on-state gate voltage in a first state of the driver circuit, the first off-state gate voltage in a second state, and the second of-state gate voltage in a third state.

An example IGBT module includes at least a first and a second reverse-conducting IGBT and at least a first and a second driver circuit. For each of the reverse-conducting IGBTs, a first diode emitter efficiency at a first off state gate voltage differs from a second diode emitter efficiency at a second off-state gate voltage. A driver terminal of each of the driver circuits is electrically coupled to a gate terminal of a corresponding one of the reverse-conducting IGBTs. Each of the driver circuits supplies, at the driver terminal, an on-state gate voltage in a first state of the driver circuit, the first off-state gate voltage in a second state, and the second off-state gate voltage in a third state.

A gate driver circuit according to a further embodiment includes a driver circuit configured to drive a gate signal for an IGBT. The driver circuit includes a driver terminal, wherein the driver circuit supplies, at the driver terminal, an on-state gate voltage in a first state, a first off-state gate voltage in a second state, and a second, different, off-state gate voltage in a third state. A control circuit is electrically coupled to the driver circuit and controls the driver circuit to change between the second and third states.

Another embodiment refers to a method of operating a reverse-conducting IGBT. In a first state, an on-state gate voltage is supplied to a gate terminal of the reverse-conducting IGBT. In a second state, a first off-state gate voltage is supplied to the gate terminal of the reverse-conducting IGBT. In a third state, a second off-state gate voltage is supplied to the gate terminal of the reverse-conducting IGBT. The reverse-conducting IGBT has a first diode emitter efficiency at the first off-state gate voltage and a second, different diode emitter efficiency at the second off-state gate voltage.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1C is a simplified circuit diagram of a half-bridge circuit in accordance with another embodiment.

FIG. 3B is a schematic cross-sectional view of a portion of a trench-type reverse-conducting IGBT in accordance with an embodiment providing field regions.

FIG. 4A is a schematic cross-sectional view of a portion of a trench-type reverse-conducting IGBT in accordance with an embodiment providing an interface layer.

FIG. 5A is a schematic cross-sectional view of a portion of a reverse-conducting IGBT in accordance with an embodiment providing contact trenches and an interface layer.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example resistors, resistive elements or elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration, which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
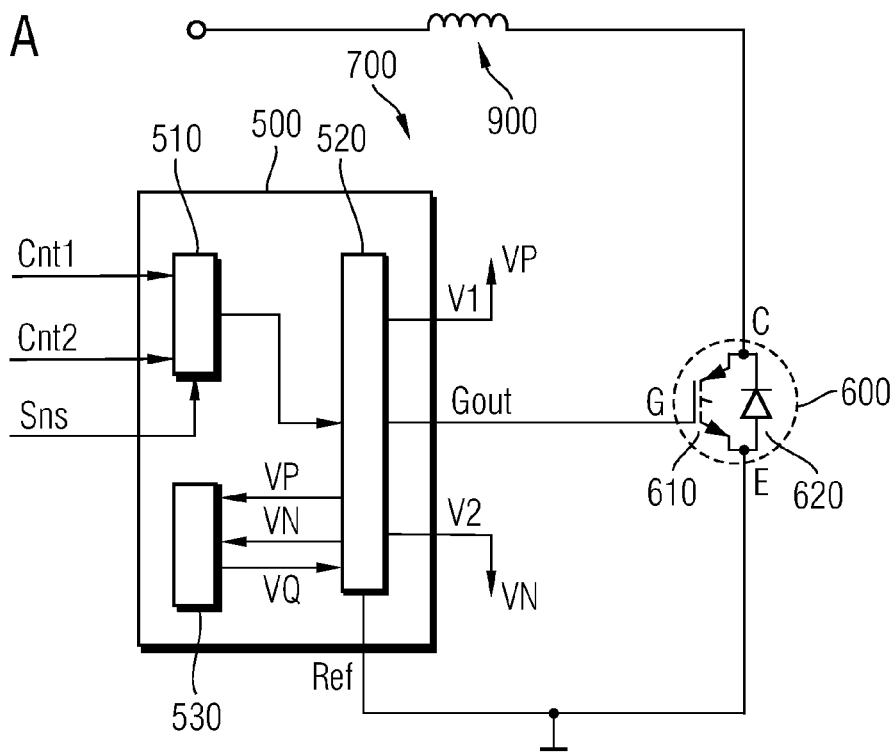
FIG. 1A is a simplified circuit diagram of an electronic circuit including a reverse-conducting IGBT and a gate driver circuit in accordance with an embodiment.

FIG. 1A shows an electronic circuit 700 including an RC-IGBT (reverse-conducting IGBT) 600 and a gate driver circuit 500 with a driver circuit 520. The RC-IGBT 600 monolithically integrates an IGBT 610 and a free-wheeling diode 620. A driver terminal Gout of the driver circuit 520 is electrically coupled to a gate terminal G of the RC-IGBT 600. A first voltage VP is applied to a first voltage terminal V1 and a second voltage VN is applied to a second voltage terminal V2 of the driver circuit 520. The first and second voltages VN, VP may be defined by reference to a potential applied at a voltage reference terminal Ref, which may be electrically connected to the emitter terminal E of the RC-IGBT 600.

The electric circuit 700 may be effective as a single-ended driver circuit for an inductive load 900 electrically coupled to a collector terminal of the RC-IGBT 600. According to other embodiments, the electric circuit 700 including the RC-IGBT 600 and the driver circuit 520 is part of half-bridge circuit. The inductive load 900 may be, for example, a motor winding, an inductive cooking plate, or a transformer winding in a switched-mode power supply.

In a first state, the driver circuit 520 applies an on-state gate voltage derived from the first voltage VP to the driver terminal Gout. In a second state, the driver circuit 520 applies a first off state gate voltage derived from the second voltage VN to the driver terminal Gout. In a third state the driver circuit 500 applies a second off-state gate voltage to the driver terminal Gout. The second off-state gate voltage differs from the on-state gate voltage and the first off state gate voltage.

The gate driver circuit 500 derives the second off-state gate voltage from a third voltage VQ. According to an embodiment a voltage regulator circuit 530 generates the third voltage VQ from the first and second voltages VP, VN. According to another embodiment, the gate driver circuit 500 may include a third voltage terminal V3 at which the third voltage VQ may be applied.

A control circuit 510 may control the driver circuit 520 to toggle a gate signal at the driver terminal Gout between the on state and one of the off-state gate voltages. The control circuit 510 may include a frequency generator, e.g., a pulse width modulator, configured to control the frequency at which the gate signal toggles and/or a pulse length of gate signal pulses.

The control circuit 510 may be adapted to provide a desaturation pulse in the gate signal, wherein the desaturation pulse switches on the IGBT for a time period that is short compared with the regular switching period. For example, the operation mode of half-bridge circuits may include a desaturation cycle during which a desaturation pulse is applied to one of the blocking IGBTs before the other one is switched on. The on state reduces the number of mobile charge carriers in a drift zone of the IGBT such that switching losses may be reduced.

Through a sense terminal Sns the control circuit 510 may receive a sense signal descriptive for a current through the inductive load 900 and may control frequency and/or pulse width of the gate signal in response to the sense signal according to an application specification. Through a first control terminal Cnt1 the control circuit 510 may receive a first control signal and may control, enable/disable, and/or start/stop the frequency generator in response to the first control signal according to the application specification.

Through a second control terminal Cnt2 the control circuit 510 may receive a second control signal and may select an operation mode concerning the use of the first and the second off-state gate voltages in response to the second control signal according to the application specification or may enable/disable one of the off-state voltages. According to other embodiments, the control circuit 510 selects the off-state gate voltage in accordance with a predefined scheme in response to internal signals or states, e.g., a currently applied switching frequency or mode of operation, such as a generator mode/motor mode, or the frequency of an alternating voltage generated by a switching power supply circuit based on the electric circuit 700.

Each of the driver circuit 520, the control circuit 510 and the voltage regulator circuit 530 may be implemented using discrete electronic elements or may be monolithically integrated. According to another embodiment, the driver circuit 520 and the control circuit 510 are monolithically integrated on the same semiconductor die with or without the voltage regulator circuit 530.

At the first off-state gate voltage, the integrated free-wheeling diode of the RC-IGBT 600 has a first diode emitter efficiency. At the second off-state gate voltage, the integrated free-wheeling diode has a second diode emitter efficiency that deviates from the first diode emitter efficiency. According to an embodiment, the difference between the first and second emitter efficiencies is at least 5%.

For example, both the first and second off-state gate voltages are above a threshold voltage at which an inversion layer is formed in a drift zone of the RC-IGBT 600 and the different emitter efficiencies result from different dimensions of the inversion layers. In accordance with an embodiment, one of the first and second off-state gate voltages is above and the other below the threshold voltage at which an inversion layer is formed in a drift zone of the RC-IGBT 600. The threshold voltage may be in the range of 0.1 V to −10 V. For example, the first and second off-state gate voltages may differ by at least 0.5 V. In the following description of effects of the embodiments, reference is made to n-channel RC-IGBTs. Similar considerations apply for p-channel RC-IGBTs as well.

Where the gate driver terminals of conventional gate driver circuits for n-channel RC-IGBTs toggle between a positive on-state gate voltage at which the RC-IGBT is in the on-state, e.g., +15 V, and one single off-state gate voltage at which the IGBT is in the off-state, e.g., −10 V, the electric circuit 700 provides two different off-state gate voltages, wherein only at one of the off-state gate voltage, e.g., at the first off-state gate voltage, is an inversion layer, which is a p-channel for n-type RC-IGBTs, formed in a drift zone of the RC-IGBT 600. At the second off-state gate voltage, no inversion layer or an inversion layer that has smaller dimensions than the inversion layer at the first off-state gate voltage is formed in the drift zone of the RC-IGBT 600.

For n-channel RC-IGBTs, the p-type inversion layer in the drift zone observably increases the diode hole emitter efficiency by at least 5%. More mobile charge carriers flood the drift zone of the RC-IGBT 600, such that the forward resistance of the monolithically integrated diode 620 is low. Since the mobile charge carriers having flooded the drift zone have to be discharged each time the diode 620 is reverse biased, switching losses are comparatively high.

At the second off-state gate voltage, no inversion layer at all or a smaller, e.g., thinner, inversion layer is formed in the drift zone. As a consequence, diode hole emitter efficiency is low and less mobile charge carriers flood the drift zone. With less mobile charge carriers, the forward resistance of the diode 620 is higher and the switching losses are lower than in case of the first off state gate voltage.

Since the IGBT 610 is in the off state for both off-state gate voltages, the electronic circuit 700 is adapted to safely switch between the first and second off-state gate voltages during operation.

The electronic circuit 700 allows tailoring of the device parameters of the free-wheeling diode of the RC-IGBT 600 in accordance with the requirements of a certain application. The two off-state gate voltages may be combined with a desaturation pulse. The RC-IGBT 600 may be operated in different operation modes and the gate driver circuit 500 may switch between two or more operation modes during operation.

In a first operation mode, which may be adapted, for example, for switching frequencies below a threshold frequency, the gate signal supplied to the gate terminal G of the RC-IGBT 600 toggles between the on-state voltage, e.g., +15 V for n-channel IGBTs, and the first off-state gate voltage, e.g., −15 V for n-channel IGBTs, providing high diode emitter efficiency without applying desaturation pulses. The on-state losses are low, at the cost of comparatively high switching losses per cycle, the total of which may be of minor importance at low switching frequencies. The threshold frequency may depend on layout and further parameters of the RC-IGBT 600, such as the breakdown voltage or voltage class for which the RC-IGBT 600 is specified. For 6.5 kV RC-IGBTs, the threshold frequency may be about 100 Hz, by way of example In a second operation mode, which may be adapted, for example, for switching frequencies above the threshold frequency, the gate signal toggles between the on-state voltage, e.g., +15 V for n-channel IGBTs, and the second off-state gate voltage, e.g., 0 V for n-channel IGBTs, providing low diode emitter efficiency. The switching losses are low, at the cost of comparatively high on-state losses, which may be of minor importance at high switching frequencies. The desaturation pulse may be saved, and therefore a good dynamic behavior maintained. The risk of a phase short-circuit in a half or full bridge environment is avoided.

In a third operation mode, the gate signal supplied to the gate terminal G of the RC-IGBT 600 toggles between the on-state voltage, e.g., +15 V for n-channel IGBTs, and the first off-state gate voltage, e.g., −15 V for n-channel IGBTs, and includes desaturation pulses at the on-state gate voltage, e.g., +15 V for n-channel IGBTs, opening the n-channel in a body zone of the RC-IGBT 600. Both the on-state losses and the switching losses are low, at the cost of a certain loss of dynamics and a certain risk of phase short-circuits in some applications.

In a fourth operation mode, the gate signal supplied to the gate terminal G of the RC-IGBT 600 toggles between the on-state voltage, e.g., +15 V for n-channel IGBTs, and the first off-state gate voltage, e.g., −15 V for n-channel IGBTs, and includes desaturation pulses at the second off-state gate voltage, e.g., 0 V for n-channel IGBT, shutting down the p-channel in the drift zone. Both the on-state losses and the switching losses are low, at the cost of a certain loss of dynamics. Since during the desaturation pulses the RC-IGBT 600 remains in the off state, the fourth operation mode avoids the risk of a phase short-circuit in some applications, at the cost of a possibly less effective desaturation cycle.

In a fifth operation mode, the gate signal supplied to the gate terminal G of the RC-IGBT 600 toggles between the on-state voltage, e.g., +15 V for n-channel IGBTs, and the second off-state gate voltage, e.g., 0 V for n-channel IGBTs, and includes desaturation pulses at the on-state gate voltage, e.g., +15 V for n-channel IGBT, opening the n-channel in the body zone. Switching losses are very low at the cost of on-state losses, a certain loss of dynamics, and a certain risk of phase short-circuits in some applications.

Figure 2:
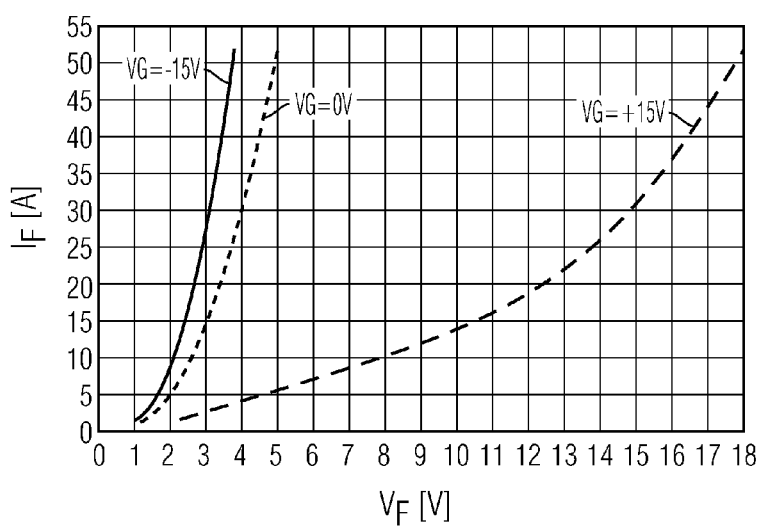
FIG. 2 is a schematic diagram for illustrating the effect of a variation of the off-state gate voltage.

FIG. 2 shows an example of the forward current $I_F$ of the diode 620 as a function of the reverse voltage $V_F$ and the gate voltage VG for an n-channel RC-IGBT having an n-type drift zone and a p-type body zone connected to an emitter electrode. At VG=0 V, only p-type zones connected to the emitter electrode contribute to the diode hole emitter efficiency. For VG=−15 V, at least a p-type inversion layer in the n-type drift zone additionally contributes to the diode hole emitter efficiency. In addition, the inversion layer may connect floating p-doped zones through non-floating p-doped zones to the emitter electrode to further increase the diode hole emitter efficiency. At a given forward current $I_F$, a negative enough off-state gate voltage may reduce the forward voltage $V_F$ by more than 10%.

Figure 1B:
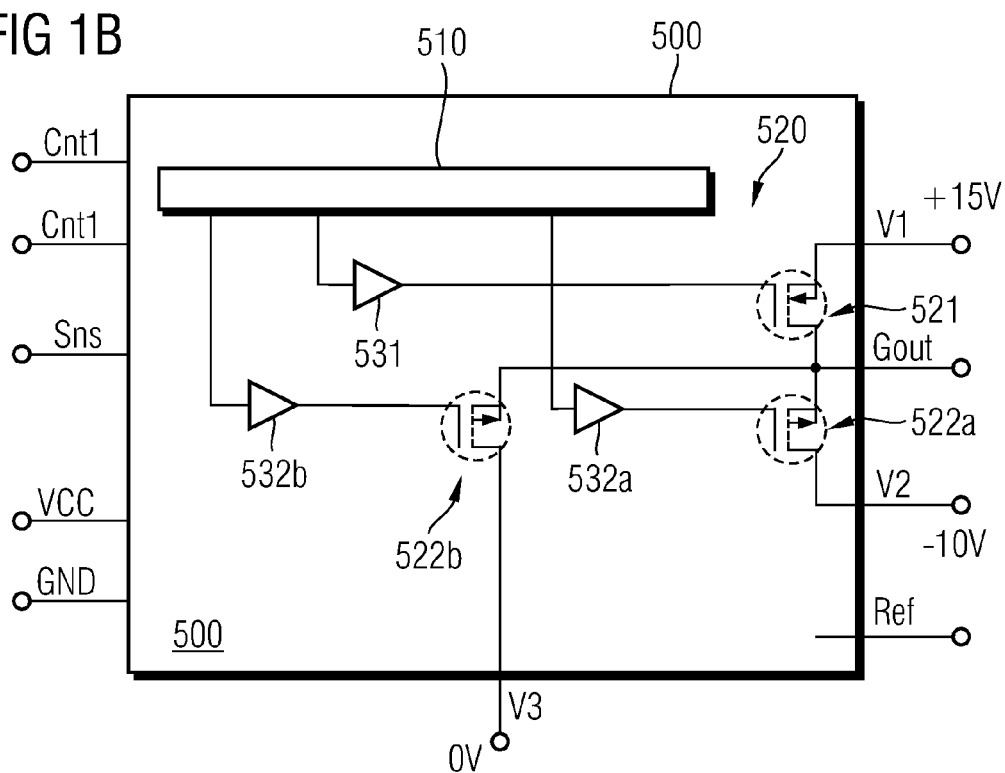
FIG. 1B is a simplified circuit diagram of a gate driver circuit in accordance with another embodiment.

FIG. 1B refers to a gate driver circuit 500 monolithically integrating the driver circuit 520 and the control circuit 510 in the same semiconductor die. The driver circuit 520 may include a push-pull driver stage with a high-side switch 521 and two parallel low-side switches 522a, 522b. The high-side switch 521 may be an n-channel IGFET (insulated gate field effect transistor) and may be connected between the first voltage terminal V1 and the driver terminal Gout. The first low-side switch 522a may be a p-channel IGFET electrically connected between the second voltage terminal V2 and the driver terminal Gout. The second low-side switch 522b may be a p-channel IGFET electrically connected between a third voltage terminal V3 and the driver terminal Gout. In the illustrated circuit, a first driver 531 controls the high-side switch 521, a second driver 532a controls the first low-side switch 522a and a third driver 532b controls the second low-side switch 522b. The voltage applied at the voltage terminals V1, V2, V3 may be referenced to a voltage applied at a voltage reference terminal Ref.

The control circuit 510 controls the drivers 531, 532, 533 such that a gate signal output at the driver terminal Gout toggles either between a voltage derived from a first voltage applied to the first voltage terminal V1 and a voltage derived from a second voltage applied to the second voltage terminal V2 or between the voltage derived from the first voltage and a voltage derived from a third voltage applied to the third voltage terminal V3. The control circuit 510 may control the second and third drivers 532a, 532b such that during a phase with the high-side switch 521 being switched off, the gate signal level changes from the voltage derived from the second voltage to the voltage derived from the third voltage or vice versa.

A first control signal applied to the first control terminal Cnt1 may start/stop toggling or modify the toggling frequency. A second control signal applied to the second control terminal Cnt2 may be used to select one of the off-state gate voltages through the low-side switches 522a, 522b. Other embodiments may provide one single control terminal combining the functions of the first and second control terminals Cnt1, Cnt2.

A sense terminal Sns may be used to feed back a current sense signal for controlling the toggling frequency and/or pulse width. Alternatively or in addition to the third voltage terminal V3, the gate driver circuit 500 may include a voltage regulator circuit for deriving the third voltage from the first and second voltages.

FIG. 1C shows the application of the electronic circuit 700 of FIG. 1A in a half-bridge circuit 702 that may be effective as a portion of full bridge circuit including the half-bridge circuit 702 and further IGBTs 603x, 604x. The inductive load 900 may be a motor winding, an inductive cooking plate, or a transformer winding in a switched-mode power supply, by way of example. The half-bridge circuit 702 includes a first RC-IBGT 601 and a second RC-IGBT 602 arranged in series, wherein one of the terminals of the inductive load 900 is connected to an emitter terminal of the first RC-IGBT 601 and to a collector terminal of the second RC-IGBT 602 and the other terminal of the inductive load 900 is connected to an emitter terminal of a third RC-IGBT 603x and to a collector terminal of a fourth RC-IGBT 604x.

The gate driver circuit 500 includes two driver circuits 520a, 520b. Each of the driver circuits 520a, 520b may in substance correspond to the driver circuit 520 of FIGS. 1A and 1B. The driver circuits 520a, 520b may include separated supply voltage systems V11, V21, Ref1 and V12, V22, Ref2 to supply the driver circuits 520a, 520b of the RC-IGBTs 601, 602 separately. The supply voltage systems are isolated from each other to withstand a DC (direct current) link voltage. The first driver circuit 520a outputs a first gate signal through the first driver terminal Gout1 and the second driver circuit 520b outputs a second gate signal at the second driver terminal Gout2. The first and second driver terminals Gout1, Gout2 are electrically coupled to the gate terminals G of the RC-IGBTs 601, 602.

The control circuit 510 controls the two gate signals such that during regular switching cycles the first and second RC-IGBTs 601, 602 are alternatingly in the on state. During desaturation cycles, the control circuit 510 may also apply desaturation pulses before switching one of the RC-IGBTs 601, 602 into the on state. A further gate driver circuit may control the third and the fourth RC-IGBTs 603x, 604x to operate as a full bridge driver circuit.

Figure 1D:
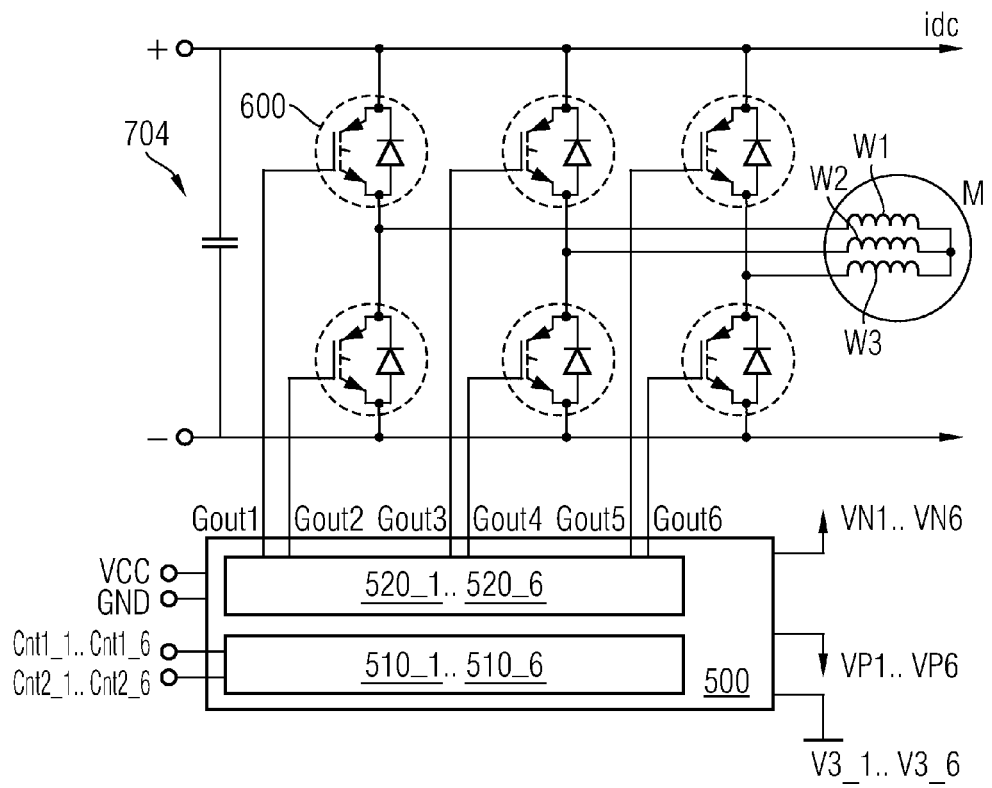
FIG. 1D is a simplified circuit diagram of an IGBT module in accordance with a further embodiment.

In FIG. 1D the electronic circuit 702 of FIG. 1A is integrated in an IGBT module 704 comprising three half bridges for driving a motor M with three windings W1, W2, W3. Each winding W1, W2, W3 is connected between a star node of the motor windings W1, W2, W3 and a node between two RC-IGBTs 600 of one of the half bridges, respectively. The gate driver circuit 500 includes the control and driver circuits 510_1 ... 510_6, 520_1 ... 520_6 for three half bridges, with each of the control and driver circuits 510_1 ... 510_6, 520_1 ... 520_6 assigned to a corresponding single one of the RC-IGBTs 600.

The above described embodiments of an electronic circuit, a half-bridge circuit and an IGBT module may include an arbitrary type of RC-IGBT 600, provided that a diode emitter efficiency at the first off-state gate voltage considerably differs from the diode emitter efficiency at the second off-state gate voltage, for example by not less than 5%.

According to an embodiment, the RC-IGBT 600 includes floating impurity zones, which are connected to non-floating impurity zones if the first off-state voltage is applied and which are not connected to the non-floating impurity zones when the second off-state voltage is applied.

The following illustrated embodiments refer to n-channel IGBTs. Principles and considerations underlying the n-channel IGBTs may be applied to p-channel IGBTs as well.

Figure 3A:
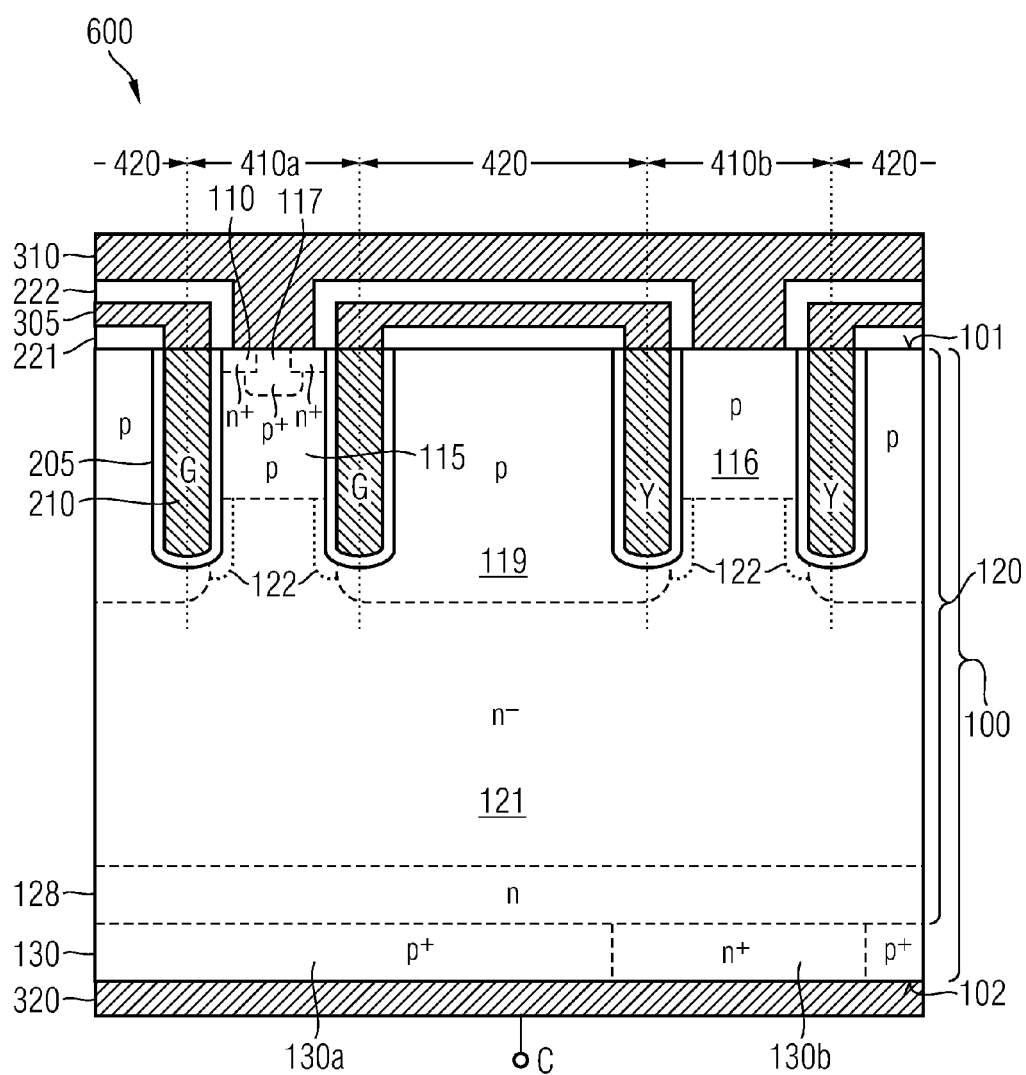
FIG. 3A is a schematic cross-sectional view of a portion of a trench-type reverse-conducting IGBT in accordance with a further embodiment.

FIG. 3A refers to an RC-IGBT 600 with a semiconductor portion 100 having a first surface 101 and a second surface 102 parallel to the first surface 101. The semiconductor portion 100 is provided from a single-crystalline semiconductor material, for example silicon Si, silicon carbide SiC, germanium Ge, a silicon germanium crystal SiGe, gallium nitride GaN or gallium arsenide GaAs. A distance between the first and second surfaces 101, 102 is a function of the breakdown voltage for which the RC-IGBT 600 is specified and is at least 30 µm, for example at least 175 µm, and may reach several 100 µm. The semiconductor portion 100 may have a rectangular shape with an edge length in the range of several millimeters. The normal to the first and second surfaces 101, 102 defines a vertical direction and directions orthogonal to the normal direction are lateral directions.

A collector layer 130 of the semiconductor portion 100 directly adjoins the second surface 102. The collector layer 130 includes p-type first portions 130a and n-type second portions 130b, which may alternate in one lateral direction or in both lateral directions. Both the first and the second portions 130a, 130b are comparatively heavily doped. For example, the mean net impurity concentrations may be higher than $5 \times 10^{17}$ cm$^{-3}$.

A semiconducting layer 120 forms an interface with the collector layer 130, wherein the interface is parallel to the first and second surfaces 101, 102. In the semiconducting layer 120 an n-type field stop layer 128 may directly adjoin the collector layer 130. The mean net impurity concentration in the field stop layer 128 is lower than in the second portions 130b of the collector layer 130. For example the mean net impurity concentration in the second portions 130b of the collector layer 130 is at least 5 times the mean net impurity concentration in the field stop layer 128. According to an embodiment, the mean net impurity concentration in the field stop layer 128 is between $1 \times 10^{16}$ cm$^{-3}$ and $1 \times 10^{17}$ cm$^{-3}$.

The semiconducting layer 120 includes an n-type drift zone 121, wherein the mean net impurity concentration in the drift zone 121 is lower than in the field stop layer 128, for example at most a tenth of the mean net impurity concentration in the field stop layer 128. According to an embodiment, the mean net impurity concentration in the drift zone 128 is between $5 \times 10^{12}$ cm$^{-3}$ and $5 \times 10^{14}$ cm$^{-3}$.

Buried electrode structures 210 extend from the first surface 101 into the semiconductor portion 100. Dielectric liners 205 separate the buried electrode structures 210 from the semiconductor material of the semiconductor portion 100. The buried electrode structures 210 may be parallel stripes arranged in a regular pattern. According to other embodiments, the lateral cross-section areas of the buried electrode structures 210 may be circles, ellipsoids, ovals or rectangles, e.g., squares, with or without rounded corners or rings. For example two or three buried electrode structures 210 may form an arrangement with two or three concentric rings, wherein the rings may be circles, ellipsoids, ovals, or rectangles, e.g., squares with rounded corners.

Between two neighboring buried electrode structures 210 or within ring-shaped buried electrode structures 210 IGBT regions 410a, diode regions 410b and spacer regions 420 may be formed in the semiconductor portion 100. Each spacer region 420 may separate two neighboring IGBT regions 410a, two neighboring diode regions 410b, or may be formed between an IGBT region 410a and a diode region 410b.

In each diode region 410b a p-type anode zone 116 extends between two neighboring buried electrode structures 210 or within a ring-shaped buried electrode structure 210 from the first surface 101 into the semiconducting layer 120. The anode zones 116 form pn-junctions with the n-type drift zone 121 and may be aligned with the second, n-type portions 130b of the collector layer 130. For example, the anode zones 116 may be formed in a vertical projection of the second portions 130b.

In each IGBT region 410a a p-type body zone 115 is formed between two neighboring buried electrode structures 210 or within a ring-shaped buried electrode structure 210 in the semiconductor portion 100 and forms a pn-junction with the n-type drift zone 121. A net impurity concentration in the body zones 115 may be approximately equal to the net impurity concentration in the anode zones 116. In each IGBT region 410a n-type source zones 110 extend from the first surface 101 into the semiconductor portion 100 and form pn-junctions with the body zone 115. P-type contact zones 117 may extend between the source zones 110 from the first surface 101 into the body zones 115. The net impurity concentration in the contact zones 117 is higher than the net impurity concentration in the body zones 115. For example, the net impurity concentration in the contact zones 117 is at least ten times the net impurity concentration in the body zones 115. The IGBT regions 410a may be aligned with the p-type first portions 130a of the collector layer 130. For example, the body zones 115 may be formed in a vertical projection of the first portions 130a.

In each spacer region 420 a p-doped floating zone 119 extends between neighboring buried electrode structures 210 or within a ring-shaped buried electrode structure 210 from the first surface 101 into the semiconductor portion 100. The floating zones 119 may extend deeper into the semiconductor portion 100 than the body and anode zones 115, 116. In accordance with an embodiment, the floating zones 119 extend deeper into the semiconductor portion than the buried electrode structures 210 and the buried electrode structures extend deeper into the semiconductor portion 100 than the body zones 115.

An emitter electrode structure 310 is provided on the first surface 101 and is electrically connected to the anode zones 116, the source zones 110 and the contact zones 117 but is not electrically connected to the floating zones 119. A collector electrode structure 320 directly adjoins the second surface 102 and is electrically connected to the collector layer 130.

Each of the emitter and collector electrode structures 310, 320 may consist of or contain, as main constituent(s), aluminum Al, copper Cu or alloys of aluminum or copper, for example AlSi, AlCu, or AlSiCu. According to other embodiments, one or both of the emitter and collector electrode structures 310, 320 may contain, as main constituent(s), nickel Ni, titanium Ti, tungsten W, silver Ag, gold Au, platinum Pt and/or palladium Pd. For example, at least one of the emitter and collector electrode structures 310, 320 includes two or more sub-layers, each sub-layer containing one or more of Ni, Ti, W, Ag, Au, Pt, and Pd as main constituent(s), e.g. nitrides and/or alloys.

A wiring structure 305 may electrically connect neighboring buried electrode structures 210. The wiring structure 305 may be provided from a highly conductive semiconductor material and/or may contain one or more metal layers provided from a metal or a metal compound, respectively. A first dielectric structure 221 electrically separates the wiring structure 305 from the floating zones 119. A second dielectric structure 222 separates the wiring structure 305 from the emitter electrode structure 310.

Buried electrode structures 210 adjoining the IGBT regions 410a are effective as gate electrodes G. A potential applied to the gate electrodes G controls a minority charge carrier distribution in a channel portion of the body zones 115 adjoining the dielectric liner 205 between the source zones 110 and the drift zone 121. If the voltage applied to the gate electrodes G is high enough, inversion layers (n-channels) are formed in the body zones 115 and an on-state current flows between the source zones 110 and the collector layer 130.

At a gate voltage of 0 V, no inversion layer is formed. If the voltage applied to the gate electrodes G is negative, p-type inversion layers 122 (p-channels) are formed in the drift zone 121 along the dielectric liner 205. The p-channels 122 may connect the p-type body zones 115 with the p-type floating zones 119. The p-type inversion layer 122 and, in the latter case, the p-type floating zones 119 contribute to diode hole emitter efficiency. As a consequence, the RC-IGBT 600 exhibits values for the diode forward current $I_F$ and for the switching losses which are significantly different for the two different off-state gate voltages. As a consequence, in each of the electronic circuit of FIG. 1A, the half-bridge circuit of FIG. 1C and the IGBT module of FIG. 1D, the RC-IGBT 600 of FIG. 3A allows for tailoring the device characteristics of the integrated free-wheeling diode of the RC-IGBTs for significantly different requirements during operation.

The diode hole emitter efficiency is a function of the total amount of p-type impurities in the p-doped zones connected to the emitter electrode structure 310 and the contact resistance between the emitter electrode structure 310 and the p-doped zones. For increasing the difference in diode hole emitter efficiency between the first and second off-state gate voltages, a first approach reduces the diode hole emitter efficiency of the body zones 115 and the contact zones 117 contributing to the diode hole emitter efficiency in both states. A second approach increases the number of p-type impurities contributing to the diode hole emitter efficiency only in the second state. Both approaches can be cumulatively combined.

In accordance with the first approach, the doping of the body zones 115 is locally reduced apart from places in close proximity to those channel portions of the body zones 115 where the n-channels are formed and the cut-off voltage for the RC-IGBT 600 is defined by the impurity concentration in the on state of the RC-IGBT 600. By reducing the geometric dimensions of the heavily doped contact zones 117, the total amount of p-type impurities and, as a consequence, hole emitter efficiency is reduced. Other embodiments may provide implanting auxiliary impurities in the body zones 115, wherein the auxiliary impurities are suited to reduce the mobile charge carrier lifetime in the body zones 115 and the contact zones 117. The auxiliary impurities may be protons, electrons or platinum atoms, by way of example.

According to the second approach, the buried electrode structures 210 may extend deeper into the semiconductor portion 100 in order to increase the dimensions of the p-channels 122.

FIG. 3B refers to an RC-IGBT 600 in a layout providing field regions 410c. The buried electrode structures 210 are arranged in a regular pattern of parallel stripes. In IGBT regions 410a, the p-type body zones 115 are formed between neighboring buried electrode structures 210. In diode regions 410b anode zones 116 extend between neighboring buried electrode structures 210 from the first surface 101 into a drift layer 121 of the semiconductor portion 100. In spacer regions 420 the p-type floating zones 119 extend between neighboring buried electrode structures 210 from the first surface 101 into the semiconductor portion 100. The body zones 115, anode zones 116 and floating zones 119 may emerge from the same implant process.

The buried electrode structures 210 extend deeper into the semiconductor portion 100 than the body zones 115, the anode zones 116 and the floating zones 119. A dielectric structure 220 electrically insulates the floating zones 119 from the emitter electrode structure 310 that is electrically connected to the anode zones 116 and through the p-doped contact zones 117 to the body zones 115. The number of buried gate electrode structures 210 in each spacer region 420 may be two, three, or more, for example at least five.

First buried electrode structures 210 in the IGBT regions 410a form gate electrodes G. Second buried electrode structures 210 in field regions 410c between the IGBT regions 410a and the spacer regions 420 are controlled independent of a voltage applied to the gate terminal G. According to an embodiment the buried electrode structures 210 in the field regions 410c do not form a p-channel in the drift layer 121 when p-channels 122 are formed in the drift layer 121 at the gate electrodes G. For example, the second buried electrode structures 210 are electrically connected with the emitter electrode structure 310 and form field electrodes E. Third buried electrode structures 210 spaced from the IGBT regions 410a may be electrically connected with the gate electrodes G and form auxiliary electrodes Y for controlling the p-channels in the drift zone 121.

When the first off state gate voltage is applied, p-channels 122 are formed along the gate and auxiliary electrodes G, Y in the drift zone 121. The p-channels 122 connect the floating zones 119 to the anode zones 116 such that the floating zones 119 contribute to the diode emitter efficiency. If a voltage is applied, at which no p-channel is formed in the drift zone 121, the floating zones 119 do not contribute to the diode emitter efficiency. As a result, the difference in diode emitter efficiency between the first and second off-state Gout voltages is high.

The embodiment of FIG. 4A differs from the embodiment of FIG. 3A in that the first electrode structure 310 includes an interface layer 311 and a main layer 312. The interface layer 311 is electrically connected to the body zones 115, for example through the contact zones 117. The interface layer 311 is provided from a contact material, wherein a contact resistance between the contact material and the contact zone 117 or the body zone 115 is high, such that overall diode emitter efficiency of the body zones 115 and the contact zones 117 is lower than without interface layer 311.

According to an embodiment, the contact material is selected such that a contact resistance between the contact material and the semiconductor portion 100 increases with decreasing impurity concentration in the semiconductor portion. For example, the contact material is selected from a group including conductive titanium and/or tantalum compounds, for example titanium tungstenide, titanium nitride, tantalum nitride and tantalum. Since the diode emitter efficiency of the body zones 115 and the contact zones 117 is low, the relative change of diode hole emitter efficiency due to the formation of p-channels is high and the differences between the device characteristics of the free-wheeling diode in the second and the third states are comparatively high.

Figure 4B:
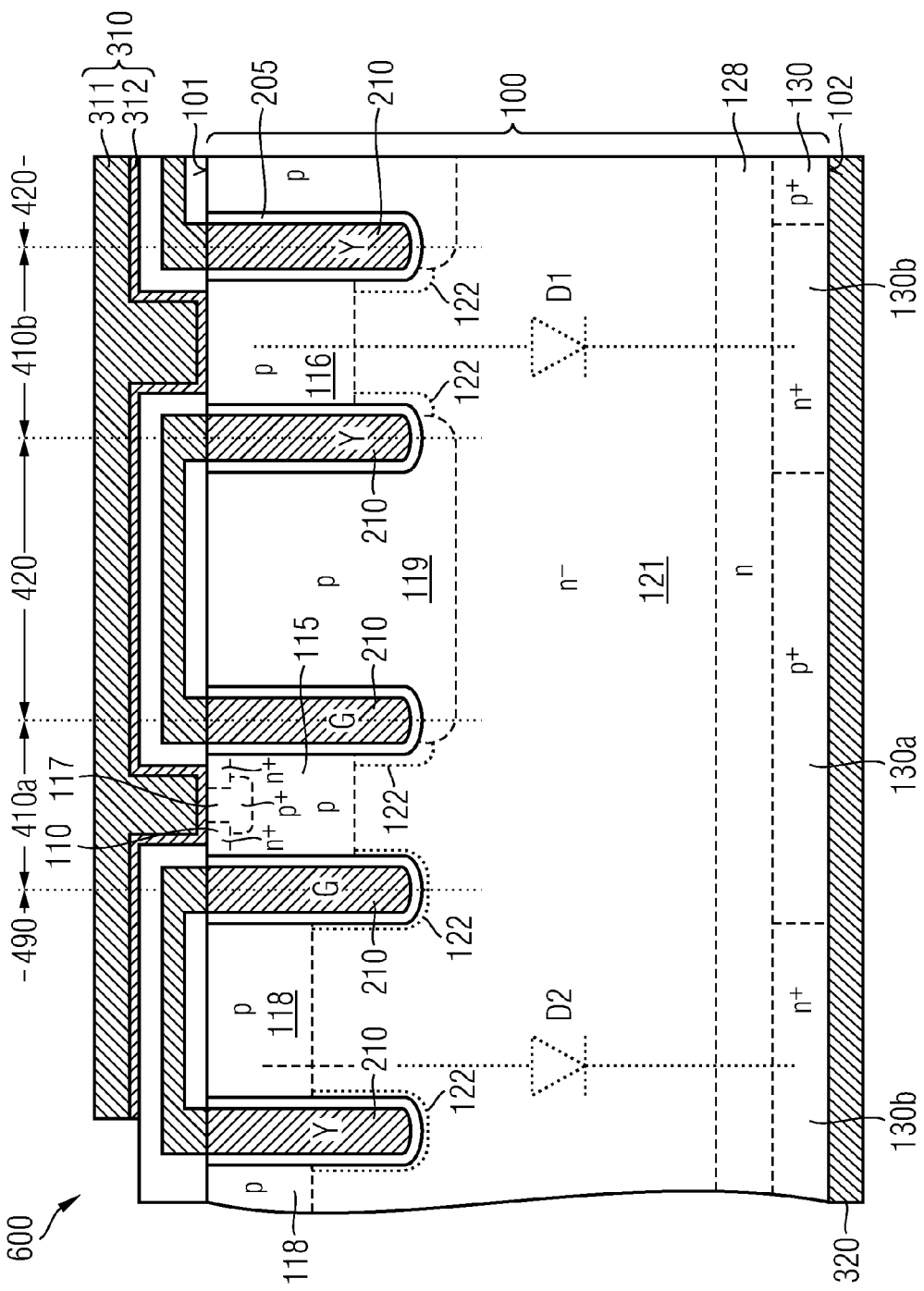
FIG. 4B is a schematic cross-sectional view of a portion of a reverse-conducting IGBT in accordance with an embodiment providing floating termination zones.

The RC-IGBT 600 of FIG. 4B in addition provides buried electrode structures 210 in an edge area 490 of the IGBT 600. The edge area 490 surrounds an active area including the IGBT regions 410a, the spacer regions 420 and the diode regions 410b in which in the on state of the IGBT 600 an on-state current flows between the emitter electrode structure 310 and the collector electrode structure 320. The edge area 490 is provided without source zones 115 but with p-type floating termination zones 118, for example guard rings, forming a further pn junction with the drift zone 121. The additional buried electrode structures 210 in the edge area 490 may be electrically connected with the gate electrodes G in the cell area to form auxiliary electrodes Y such that when applying the first off-state gate voltage to the gate electrodes G the floating p-type termination zones 118 contribute to the diode hole emitter efficiency and form a second free-wheeling diode structure D2 parallel to a first free-wheeling diode D1 within the active area.

The embodiment of FIG. 5A provides trench contacts 302 extending from the first surface 101 into the semiconductor portion 100 between neighboring buried electrode structures 210 or within a ring-shaped buried electrode structure 210. The trench contacts 302 may include an interface layer 311 directly adjoining the semiconductor portion 100 and a main layer 312.

The trench contacts 302 replace a part of the heavily doped contact zones 117 and reduce the hole emitter efficiency of the non-floating p-type zones 115, 117, 116. A difference between the two off-states is increased. The interface layer 311 may be provided from a contact material whose contact resistance to the semiconductor portion 100 increases with decreasing impurity concentration in the semiconductor portion 100. For example, the contact material is selected from a group including TiW, TiN, TaN, and Ta.

Figure 5B:
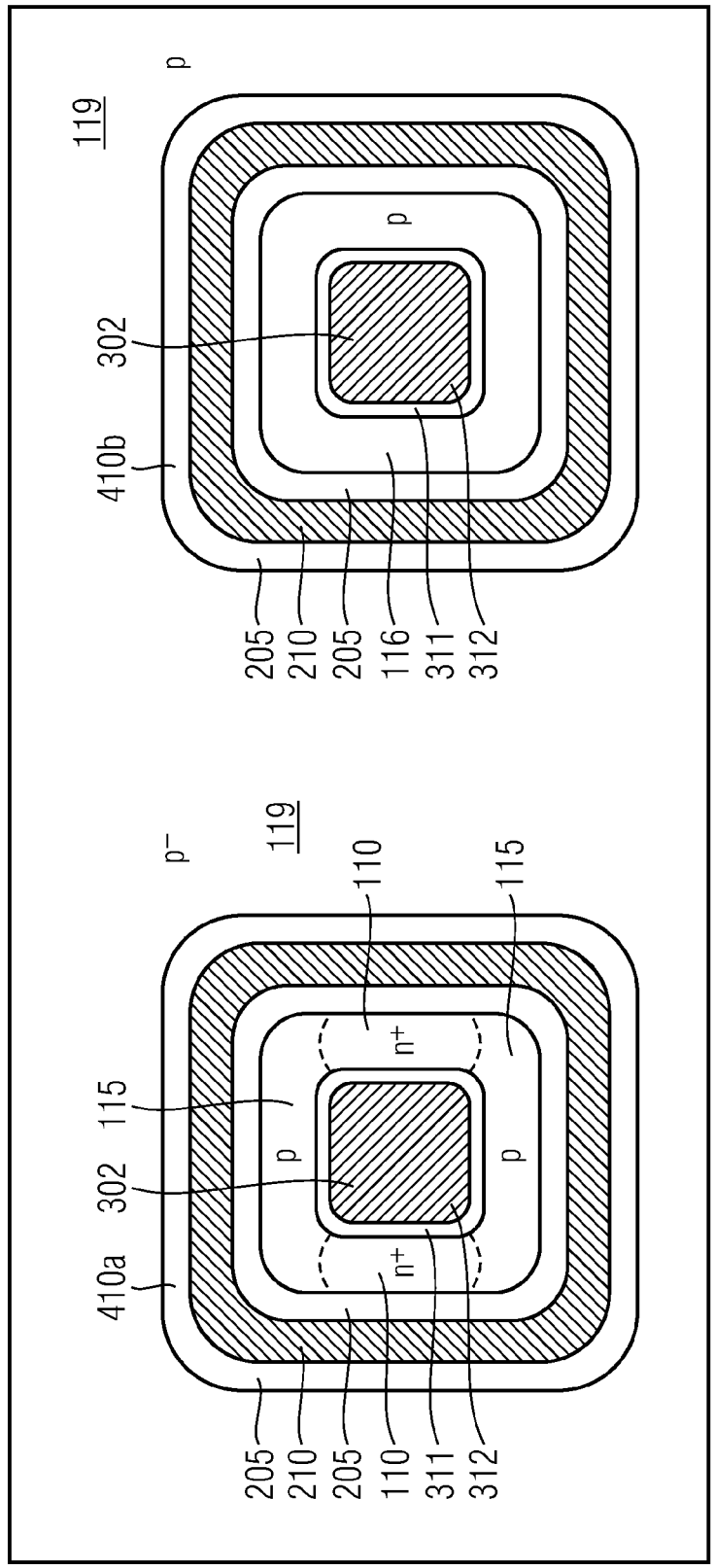
FIG. 5B is a schematic cross-sectional view of the portion of the reverse-conducting IGBT of FIG. 5A along line B-B.

FIG. 5B shows a cross-section through the RC-IGBT 600 of FIG. 5A parallel to the first and second surfaces 101, 102 through the trench contacts 302 as illustrated by line B-B in FIG. 5A. On the left-hand side, a first ring-shaped buried electrode structure 210 defines an IGBT region 410a. The source zone 110 may be ring-shaped and may surround the trench contact 302 on all sides. According to an embodiment, the source zone 110 is formed along only one of the edges of the respective trench contact 302. According to the illustrated embodiment, two spatially separated portions of the source zone 100 are formed at opposing sides of the trench contact 302. On the right-hand side, a second ring-shaped buried electrode structure 210 defines a diode region 410b. The spacer region 420 embeds the IGBT and diode regions 410a, 410b.

A further embodiment refers to a half-bridge circuit including a first and a second reverse-conducting IGBT with a first diode emitter efficiency at a first off-state gate voltage and a second, different diode emitter efficiency at a second off-state gate voltage, respectively, and a first and a second driver circuit, each of the driver circuits comprising a driver terminal electrically coupled to a gate terminal of one of the reverse-conducting IGBTs, wherein each of the driver circuits is configured to supply, at the driver terminal, an on-state gate voltage in a first state, the first off-state gate voltage in a second state, and the second off-state gate voltage in a third state. Each of the reverse-conducting IGBTs may be adapted to form a first inversion layer in a body zone in the first state, a second inversion layer in a drift zone in the second state, and no or a third inversion layer, which is different from the second inversion layer, in the third state. Alternatively or in addition, the second diode emitter efficiency may deviate from the first diode emitter efficiency by at least 5%.

Another embodiment refers to an IGBT module including at least a first and a second reverse-conducting IGBT with a first diode emitter efficiency at a first off-state gate voltage and a second, different diode emitter efficiency at a second off-state gate voltage, respectively; and at least a first and a second driver circuit, each of the driver circuits comprising a driver terminal electrically coupled to a gate terminal of one of the reverse-conducting IGBTs, wherein each of the driver circuits is configured to supply, at the driver terminal, in a first state an on-state gate voltage, in a second state the first off-state gate voltage, and in a third state the second off-state gate voltage.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic circuit comprising:
   a reverse-conducting IGBT having a first diode emitter efficiency at a first off-state gate voltage and having a second, different diode emitter efficiency at a second off-state gate voltage; and
   a driver circuit comprising a driver terminal electrically coupled to a gate terminal of the reverse-conducting IGBT, wherein the driver circuit is configured to drive, at the driver terminal, an on-state gate voltage in a first state, the first off-state gate voltage in a second state, and the second off-state gate voltage in a third state.

2. The electronic circuit according to claim 1, wherein the driver circuit is configured to derive the on-state gate voltage from a first voltage applied to a first voltage terminal and the first off state gate voltage from a second voltage applied to a second voltage terminal.

3. The electronic circuit according to claim 2, wherein the driver circuit is configured to derive the second off-state gate voltage from a third voltage applied to a third voltage terminal.

4. The electronic circuit according to claim 2, comprising a voltage regulator circuit configured to derive the second off-state gate voltage from the first and second voltages.

5. The electronic circuit according to claim 1, wherein the second off-state gate voltage deviates from the first off state gate voltage by at least 0.5 V.

6. The electronic circuit according to claim 1, wherein the second diode emitter efficiency deviates from the first diode emitter efficiency by at least 5%.

7. The electronic circuit according to claim 1, further comprising a control circuit configured to control the driver circuit to change between the second and third states.

8. The electronic circuit according to claim 7, wherein the control circuit controls the driver circuit to change between the second and third states in response to a control signal applied to the control circuit.

9. The electronic circuit according to claim 7, wherein the control circuit controls the driver circuit to change between the second and third states in response to a change of an internal state.

10. The electronic circuit of claim 1, wherein the reverse-conducting IGBT is adapted to form a first inversion layer in a body zone at the on-state gate voltage, a second inversion layer in a drift zone at the first off-state gate voltage, and no or a third inversion layer in the drift zone at the second off-state gate voltage, wherein the third inversion layer differs from the second inversion layer.

11. The electronic circuit according to claim 1, wherein the reverse-conducting IGBT comprises a gate electrode extending from a first surface into a drift zone of a semiconductor portion, wherein the drift zone has a first conductivity type, a body zone of a second, opposite conductivity type is arranged between the first surface and the drift zone, and a dielectric liner separates the gate electrode and the semiconductor portion.

12. The electronic circuit of claim 11, wherein the semiconductor portion comprises a floating zone of the second conductivity type, wherein the floating zone floats in the first and third states and the second inversion layer connects the body zone and the floating zone in the second state.

13. The electronic circuit of claim 11, wherein a trench contact extends from the first surface into the body zone.

14. The electronic circuit of claim 11, wherein an interface layer is provided between the body zone and an electrode structure electrically connected to the body zone, the interface layer provided from a contact material, wherein a contact resistance between the contact material and the body zone increases with decreasing impurity concentration in the body zone.

15. The electronic circuit of claim 14, wherein the contact material is selected from a group consisting of TiW, TiN, TaN, and Ta.

16. A half-bridge circuit comprising at least two electronic circuits according to claim 1, wherein the reverse-conducting IGBTs of the at least two electronic circuits are electrically arranged in series.

17. An IGBT module comprising at least two electronic circuits according to claim 1.

18. A gate driver circuit comprising:
   a driver circuit configured to drive a gate signal for an IGBT and comprising a driver terminal, wherein the driver circuit is configured to drive, at the driver terminal, an on-state gate voltage in a first state, a first off-state gate voltage in a second state, and a second off-state gate voltage in a third state, the second off-state gate voltage differing from the first off-state gate voltage; and
   a control circuit electrically coupled to the driver circuit and configured to control the driver circuit to change between the second and third states.

19. A method of operating a reverse-conducting IGBT, the method comprising:
   driving, in a first state, an on-state gate voltage to a gate terminal of the reverse-conducting IGBT;
   driving, in a second state, a first off-state gate voltage to the gate terminal of the reverse-conducting IGBT; and
   driving, in a third state, a second off-state gate voltage to the gate terminal of the reverse-conducting IGBT;
   wherein the reverse-conducting IGBT has a first diode emitter efficiency at the first off-state gate voltage and a second, different, diode emitter efficiency at the second off-state gate voltage.

20. The method according to claim 19, wherein the second diode emitter efficiency deviates from the first diode emitter efficiency by at least 5%.

* * * * *